(12) United States Patent
Lim et al.

(10) Patent No.: US 8,773,417 B2
(45) Date of Patent: Jul. 8, 2014

(54) SYSTEM AND METHOD FOR TRANSMITTING AND RECEIVING SIGNALS

(75) Inventors: Jung-pil Lim, Uiwang-si (KR); Dong-hoon Baek, Seoul (KE); Ji-hoon Kim, Seoul (KR); Jae-youl Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1266 days.

(21) Appl. No.: 12/603,705

(22) Filed: Oct. 22, 2009

(65) Prior Publication Data
US 2010/0134467 A1 Jun. 3, 2010

(51) Int. Cl.
*G06F 3/038* (2013.01)
*G09G 5/00* (2006.01)

(52) U.S. Cl.
USPC .......................................................... 345/211

(58) Field of Classification Search
None
See application file for complete search history.

(56) References Cited

U.S. PATENT DOCUMENTS

| | | | |
|---|---|---|---|
| 6,946,804 B2 | 9/2005 | You | |
| 2003/0042983 A1 | 3/2003 | Hollenbeck et al. | |
| 2004/0104903 A1* | 6/2004 | You | 345/204 |
| 2006/0234650 A1* | 10/2006 | Lee et al. | 455/78 |
| 2008/0150930 A1* | 6/2008 | Nam et al. | 345/212 |

FOREIGN PATENT DOCUMENTS

| | | | |
|---|---|---|---|
| CN | 1514546 A | | 7/2004 |
| CN | 1694143 A | | 11/2005 |
| CN | 1835485 A | | 9/2006 |
| EP | 0717527 A2 | | 11/1995 |
| JP | 2006146885 | | 6/2006 |
| JP | 20070307661 | | 11/2007 |
| JP | 2008182727 A | * | 8/2008 |
| KR | 20030069783 A | * | 8/2003 |
| KR | 20040013752 A | | 2/2004 |
| KR | 20040081156 A | | 9/2004 |
| WO | WO2007102135 | | 9/2007 |

\* cited by examiner

*Primary Examiner* — Alexander S Beck
*Assistant Examiner* — Kirk Hermann
(74) *Attorney, Agent, or Firm* — Volentine & Whitt, PLLC

(57) ABSTRACT

A system for transmitting and receiving a signal includes a transmitter that switches a first reference voltage and a second reference voltage and generates first and second voltage signals, and a receiver the receives the first and second voltage signals. The transmitter includes a reference voltage generator that generates the first reference voltage and the second reference voltage, and a switch block that switches the first reference voltage and the second reference voltage and outputs the first and second voltage signals. The receiver includes a resistor having two terminals to which the first and second voltage signals are applied.

20 Claims, 10 Drawing Sheets

FIG. 7

| $V_{OD}$ | Band width | Voltage Gain |
|---|---|---|
| 200mV | GOOD ↑ | ↓ |
| 300mV | | |
| 400mV | | |
| 500mV | | |
| 600mV | | GOOD |

FIG. 8

| $R_{TX}$ | EMI | Band width |
|---|---|---|
| – | GOOD ↑ | ↓ |
| 320Ω | | |
| 160Ω | | |
| 120Ω | | |
| 80Ω | | GOOD |

FIG. 9

| $R_{RX}$ | Voltage Gain | Band width |
|---|---|---|
| – | ↓ | GOOD ↑ |
| 400Ω | | |
| 600Ω | | |
| 800Ω | | |
| OPEN | GOOD | |

FIG. 10

| Interface | mLVDS | Wisebus | INVENTIVE CONCEPT |
|---|---|---|---|
| Condition | IBIAS=2mA | Iref=600uA | dV=0.4V, Mtx=10 |
| Reak Current | 14.5mA | 15.1mA | 13.7mA |
| Average current | 5.01mA | 7.65mA | 4.52mA |

SYSTEM AND METHOD FOR TRANSMITTING AND RECEIVING SIGNALS

CROSS-REFERENCE TO RELATED APPLICATIONS

A claim of priority is made to Korean Patent Application No. 10-2008-0120685, filed on Dec. 1, 2008, in the Korean Intellectual Property Office, the subject matter of which is hereby incorporated by reference.

BACKGROUND

The inventive concept relates to systems and methods for transmitting and receiving a voltage signal, and more particularly, to a system and a method for transmitting and receiving differential voltage signals having a low voltage difference.

Resistances of metal lines used as transmission channels in chip on glass (COG) environments and capacitances between metal lines and substrates are relatively high. When a signal transmitted and received through a metal line in a COG state is a current signal, the transmission speed of the signal becomes slower as the resistance and capacitance increase. Thus, it is difficult to increase operating frequency of a system for transmitting and receiving a voltage signal in a COG environment. Also, resistance and capacitance in a COG environment cause distortion of transmitted and received signals.

SUMMARY

According to an aspect of the inventive concept, there is provided a system for transmitting and receiving a signal. The system includes a transmitter that switches a first reference voltage and a second reference voltage and generates first and second voltage signals, and a receiver that receives the first and second voltage signals. The transmitter includes a reference voltage generator that generates the first reference voltage and the second reference voltage, and a switch block that switches the first reference voltage and the second reference voltage and outputs the first and second voltage signals. The receiver includes a resistor having two terminals to which the first and second voltage signals are applied.

According to another aspect of the inventive concept, there is provided a system for transmitting and receiving a signal that includes a timing controller having a transmitter for converting display data into first and second voltage signals and for transmitting the first and second voltage signals to a source driver that includes a receiver. The timing controller includes a reference voltage generator that generates a first reference voltage and a second reference voltage, and a switch block that switches the first reference voltage and the second reference voltage and outputs the first and second voltage signals. The source driver includes a resistor to which the first and second voltage signals are applied.

According to another aspect of the inventive concept, there is provided a method of transmitting and receiving a signal between a transmitter and a receiver. The method includes converting a signal to be transmitted by the transmitter into at least two voltage signals; receiving the converted voltage signals at the receiver; and equalizing the received voltage signals and comparing the equalized voltage signals, where the receiver is installed on a glass substrate.

BRIEF DESCRIPTION OF THE DRAWINGS

Various embodiments of the inventive concept will be described in further detail with reference to the attached drawings, in which:

FIG. 7 shows computer simulation results for bandwidth and voltage gain according to magnitudes of two voltage signals, according to an illustrative embodiment;

FIG. 8 shows computer simulation results for bandwidth and electromagnetic interference (EMI) according to changes in a resistance component of a transmitting terminal, according to an illustrative embodiment;

FIG. 9 shows computer simulation results for bandwidth and voltage gain according to changes in a resistance component of a receiving terminal, according to an illustrative embodiment;

FIG. 10 is a table showing electrical characteristics of various implementations, including an embodiment of the inventive concept, for purposes of comparison;

DETAILED DESCRIPTION OF THE EMBODIMENTS

Figure 1:
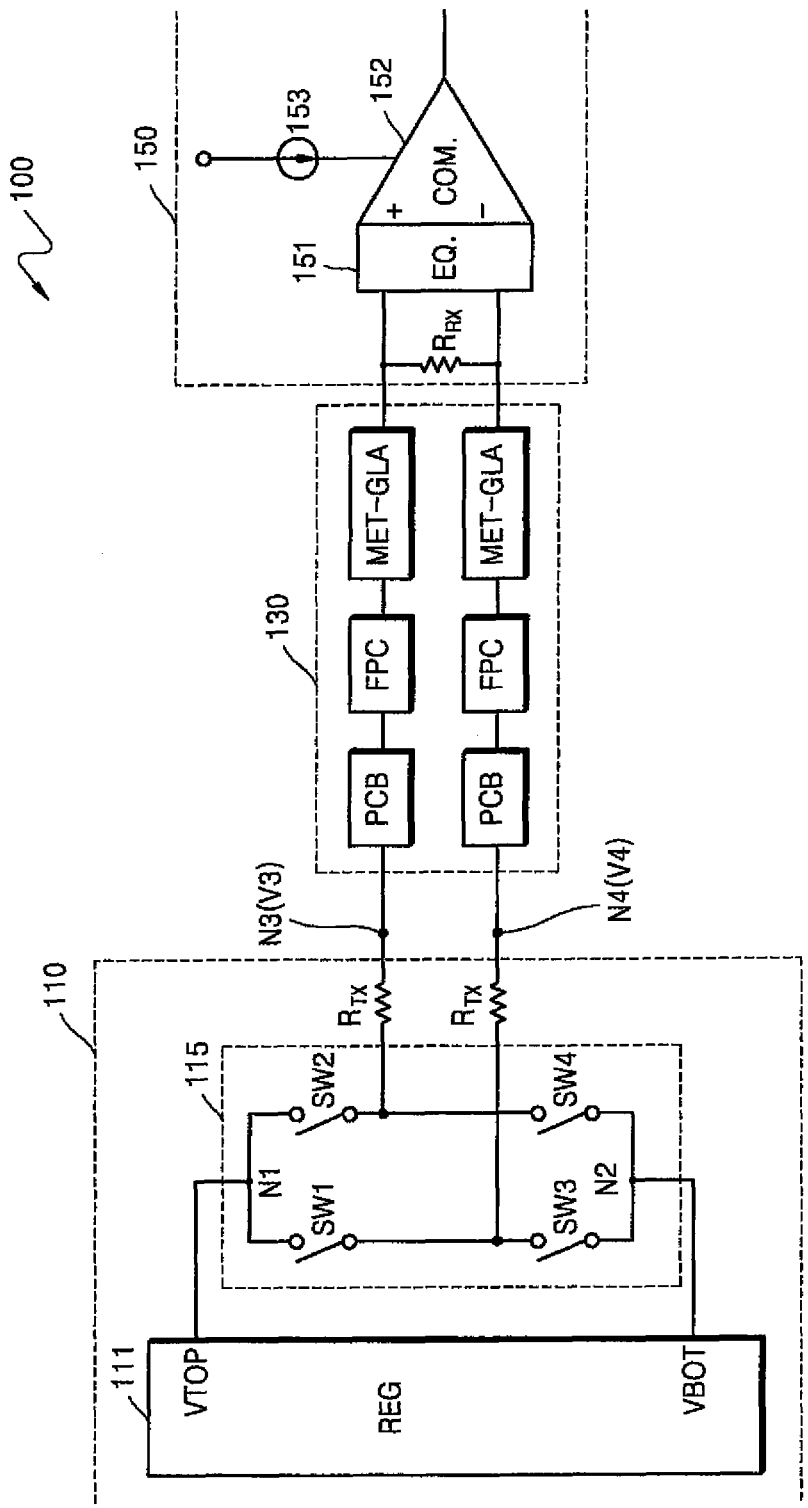
FIG. 1 is a block diagram showing a system for transmitting and receiving a signal, according to an illustrative embodiment.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

FIG. 1 is a block diagram showing a system 100 for transmitting and receiving a signal, according to an illustrative embodiment.

Referring to FIG. 1, the system 100 for transmitting and receiving a signal includes a transmitter 110, a receiver 150, and a transmission line 130 for electrically connecting the transmitter 110 and the receiver 150. The signal may include differential voltage signals having a low voltage difference, for example. The transmitter 110 may be installed on a printed circuit board (PCB), the receiver 150 may be installed on a glass substrate, and the PCB and the glass substrate may be connected to a flexible printed circuit (FPC), for example.

The transmitter 110 includes a reference voltage generator 111 which generates first and second reference voltages VTOP and VBOT, and a switch block 115 which switches the first and second reference voltages VTOP and VBOT and outputs first and second voltage signals V3 and V4. Two switch equivalent resistors $R_{TX}$ indicate equivalent turn on resistors of a metal oxide semiconductor (MOS) transistor switch that constitutes the switch block 115.

The transmission line 130 that electrically connects the transmitter 110 and the receiver 150 includes the PCB, the FPC, and a metal line MET_GLA that is installed on the glass substrate. Each of the PCB, the FPC, and the metal line MET_GLA has a constant impedance component.

The receiver 150 includes a resistor $R_{RX}$ connected to the transmission line 130, an equalizer 151 which equalizes voltages across the resistor $R_{RX}$, and a comparator 152 which compares the equalized voltages. Current source 153 supplies current to the comparator 152.

The reference voltage generator 111 illustrated in FIG. 1 will first be described in detail with reference to FIG. 2.

Figure 2:
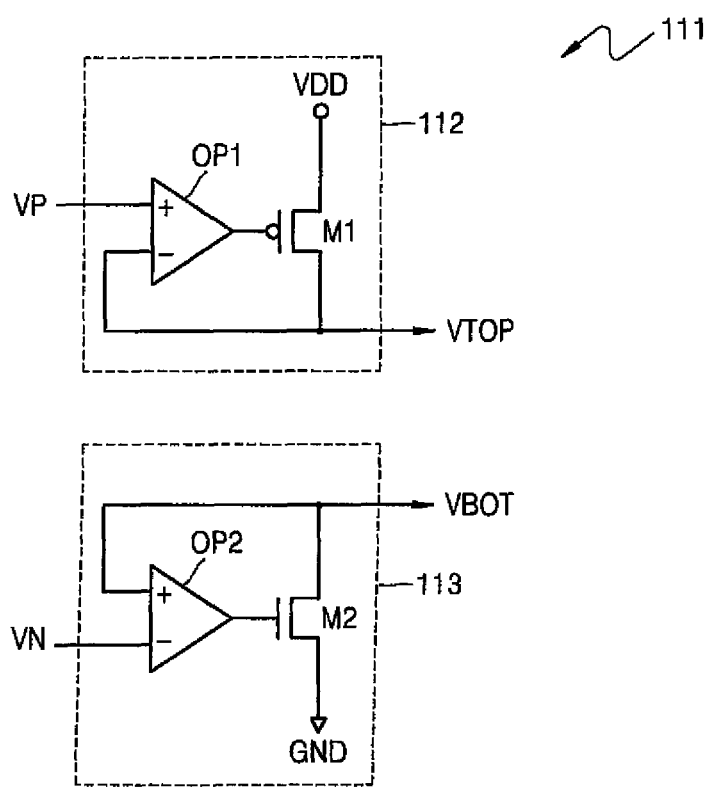
FIG. 2 is a circuit diagram showing a reference voltage generator of the system illustrated in FIG. 1, according to an illustrative embodiment.

FIG. 2 is a circuit diagram showing the reference voltage generator 111 of the system 100, illustrated in FIG. 1, according to an illustrative embodiment of the inventive concept. Referring to FIG. 2, the reference voltage generator 111 includes a first reference voltage generator 112 and a second reference voltage generator 113.

The first reference voltage generator 112 generates the first reference voltage VTOP in response to a first bias voltage VP using a negative feedback circuit, including a first differential operational amplifier OP1 and a first metal oxide semiconductor (MOS) transistor M1. The first differential operational amplifier OP1 receives the first bias voltage VP applied to a first input terminal (+) of the first differential operational amplifier OP1, and the generated first reference voltage VTOP is applied to a second input terminal (−) of the first differential operational amplifier OP1. A first terminal of the first MOS transistor M1 is connected to a first supply voltage source supplying voltage VDD, and an output terminal of the first differential operational amplifier OP1 is connected to a gate of the first MOS transistor M1. The first MOS transistor M1 generates the first reference voltage VTOP at a second terminal of the first MOS transistor M1, in response to an output voltage from the output terminal of the first differential operational amplifier OP1.

The second reference voltage generator 113 generates the second reference voltage VBOT in response to a second bias voltage VN using a negative feedback circuit, including a second differential operational amplifier OP2 and a second MOS transistor M2. The second differential operational amplifier OP2 receives the second bias voltage VN applied to a first input terminal (−) of the second differential operational amplifier OP2, and the generated second reference voltage VBOT is applied to a second input terminal (+) of the second differential operational amplifier OP2. A first terminal of the second MOS transistor M2 is connected to a ground voltage source GND, and an output terminal of the second differential operational amplifier OP2 is connected to a gate of the second MOS transistor M2. The second MOS transistor M2 generates the second reference voltage VBOT at a second terminal of the second MOS transistor M2, in response to an output voltage from the output terminal of the second differential operational amplifier OP2.

The first reference voltage VTOP and the second reference voltage VBOT, which are generated by the first reference voltage generator 112 and the second reference voltage generator 113, respectively, remain constant regardless of the load of the first reference voltage generator 112 and the load of the second reference voltage generator 113.

Figure 3:
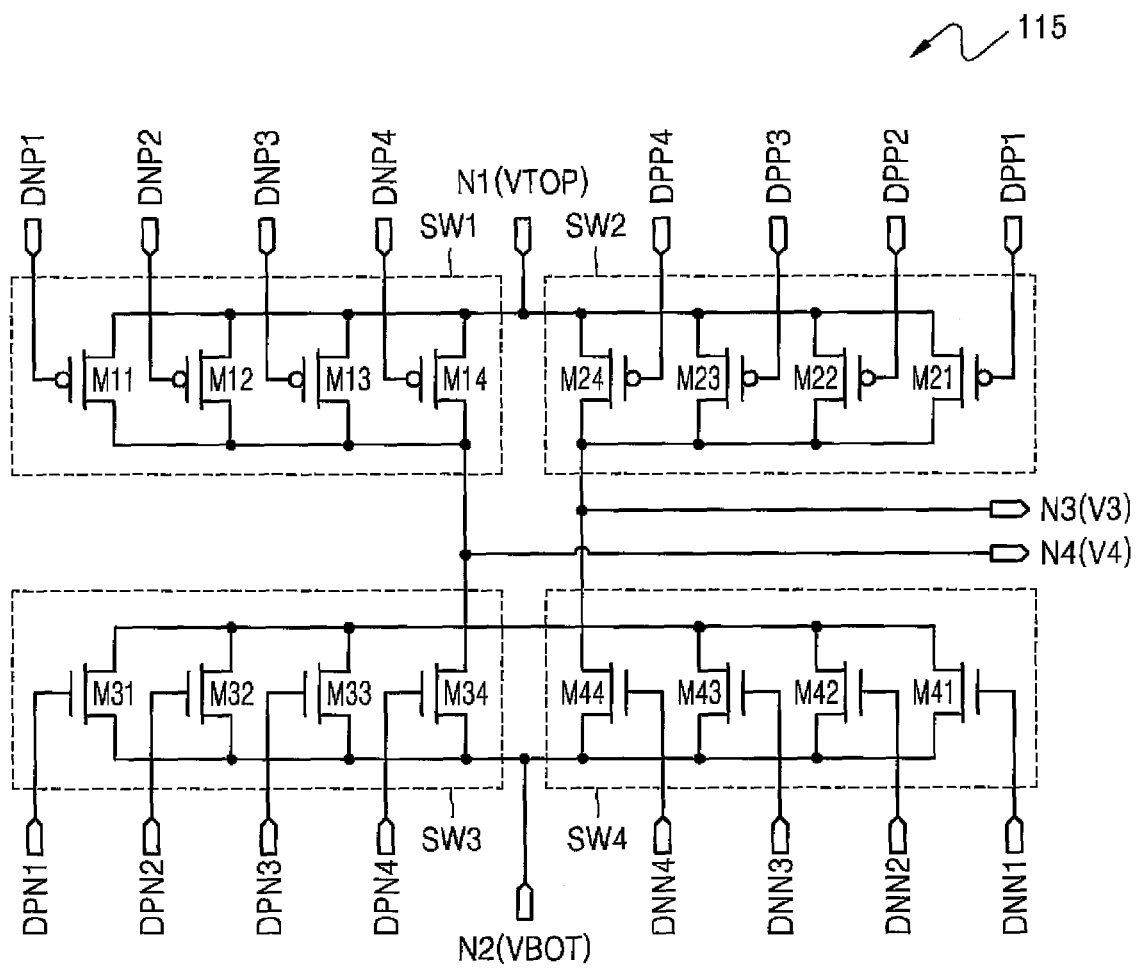
FIG. 3 is a circuit diagram showing a switch block of the system illustrated in FIG. 1, according to an illustrative embodiment.

Referring to FIGS. 1 and 3, the switch block 115 includes four switch arrays SW1 to SW4. The first switch array SW1 switches the first reference voltage VTOP in response to at least one of first switch control signals DNP1 to DNP4 (see FIG. 3), and outputs the second voltage signal V4 to fourth node N4. The second switch array SW2 switches the first reference voltage VTOP in response to at least one of second switch control signals DPP1 to DPP4, and outputs the first voltage signal V3 to third node N3. The third switch array SW3 switches the second reference voltage VBOT in response to at least one of third switch control signals DPN1 to DPN4, and outputs the second voltage signal V4 to the fourth node N4. The fourth switch array SW4 switches the second reference voltage VBOT in response to at least one of four switch control signals DNN1 to DNN4, and outputs the first voltage signal V3 to the third node N3.

FIG. 3 is a circuit diagram showing the switch block 115 of the system 100 illustrated in FIG. 1, according to an illustrative embodiment of the inventive concept.

Referring to FIG. 3, although indicated by a single representative switch in FIG. 1, each of the switch arrays SW1 to SW4 may include four switches connected in parallel, in the depicted embodiment. However, according to various alternative embodiments, the number of switches in each switch array and connected in parallel may be greater than or less than four.

The first switch array SW1 includes four first switch transistors M11 to M14. Each of the first switch transistors M11 to M14 switches the first reference voltage VTOP applied to a first terminal of the first switch array SW1 in response to the first switch control signals DNP1 to DNP4, respectively, applied to corresponding gates of the first switch transistors M11 to M14. The first switch transistors M11 to M14 output the second voltage signal V4 to the fourth node N4 connected to a second terminal of the first switch array SW1.

The second switch array SW2 includes four second switch transistors M21 to M24. Each of the second switch transistors M21 to M24 switches the first reference voltage VTOP applied to a first terminal of the second switch array SW2 in response to the second switch control signals DPP1 to DPP4, respectively, applied to corresponding gates of the second switch transistors M21 to M24. The second switch transistors M21 to M24 output the first voltage signal V3 to the third node N3 connected to a second terminal of the second switch array SW2.

The third switch array SW3 includes four third switch transistors M31 to M34. Each of the third switch transistors M31 to M34 switches the second reference voltage VBOT applied to a first terminal of the third switch array SW3 in response to the third switch control signals DPN1 to DPN4, respectively, applied to corresponding gates of the third switch transistors M31 to M34. The third switch transistors M31 to M34 output the second voltage signal V4 to the four node N4 connected to a second terminal of the third switch array SW3.

The fourth switch array SW4 includes four fourth switch transistors M41 to M44. Each of the fourth switch transistors M41 to M44 switches the second reference voltage VBOT applied to a first terminal of the fourth switch array SW4 in response to the fourth switch control signals DNN1 to DNN4, respectively, applied to corresponding gates of the fourth switch transistors M41 to M44. The fourth switch transistors M41 to M44 output the first voltage signal V3 to the third node N3 connected to a second terminal of the fourth switch array SW4.

Each of the first, second, third and fourth switch transistors M11 to M14, M21 to M24, M31 to M34 and M41 to M44, which are included in the first through fourth switch arrays SW1 to SW4 respectively, are connected to one another in parallel. Thus, equivalent resistance that is generated when all of the four switch transistors M11 to M14, M21 to M24, M31 to M34 or M41 to M44 are turned on may be less than equivalent resistance that is generated when fewer than four of switch transistors are turned on. Thus, the fewer switch transistors turned on, the higher the equivalent resistance of a corresponding switch array.

Equivalent resistance of each of the first through fourth switch arrays SW1 to SW4 affects voltage gain between the transmitter 110 and the receiver 150 and the frequency of a differential voltage signal output from the transmitter 110. This is described in detail below.

The switch arrays SW1 through SW4 illustrated in FIGS. 1 and 3 may be activated and inactivated (turned on and off) in pairs. For example, in an embodiment, a pair consisting of the first switch array SW1 and the fourth switch array SW4 are collectively turned on and off, and a pair consisting of the second switch array SW2 and the third switch array SW3 are collectively turned on and off, as described below.

Figure 4:
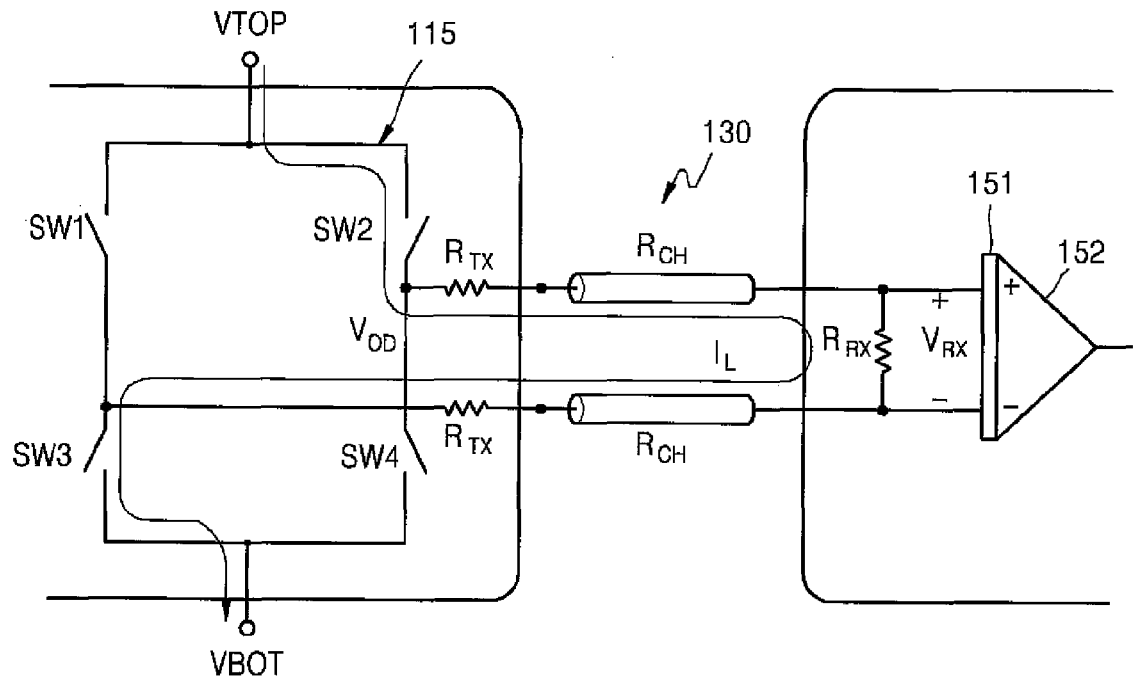
FIG. 4 is a block diagram showing a voltage signal generated when second and third switch arrays of the switch block of the system of FIG. 1 are turned on, according to an illustrative embodiment.

FIG. 4 is a block diagram showing a voltage signal generated when second and third switch arrays SW2 and SW3 of the switch block 115 of the system of FIG. 1 are turned on, according to an illustrative embodiment.

Referring to FIG. 4, when the second and third switch arrays SW2 and SW3 are turned on, a direct current (DC) path is formed from the first reference voltage generator 112 through the second switch array SW2, an upper transmission line $R_{CH}$, the resistor $R_{RX}$, a lower transmission line $R_{CH}$ and the third switch array SW3 to the second reference voltage VBOT. Thus, the voltage applied to a positive input terminal (+) of the comparator 152 of the receiver 150 is higher than the voltage applied to a negative input terminal (−) of the comparator 152. Here, each of the upper and lower transmission lines $R_{CH}$ is constituted by modelling the sum of equivalent resistance of each of the PCB, the FPC, and the metal line MET_GLA installed on the glass substrate, which are included in the transmission line 130.

Figure 5:
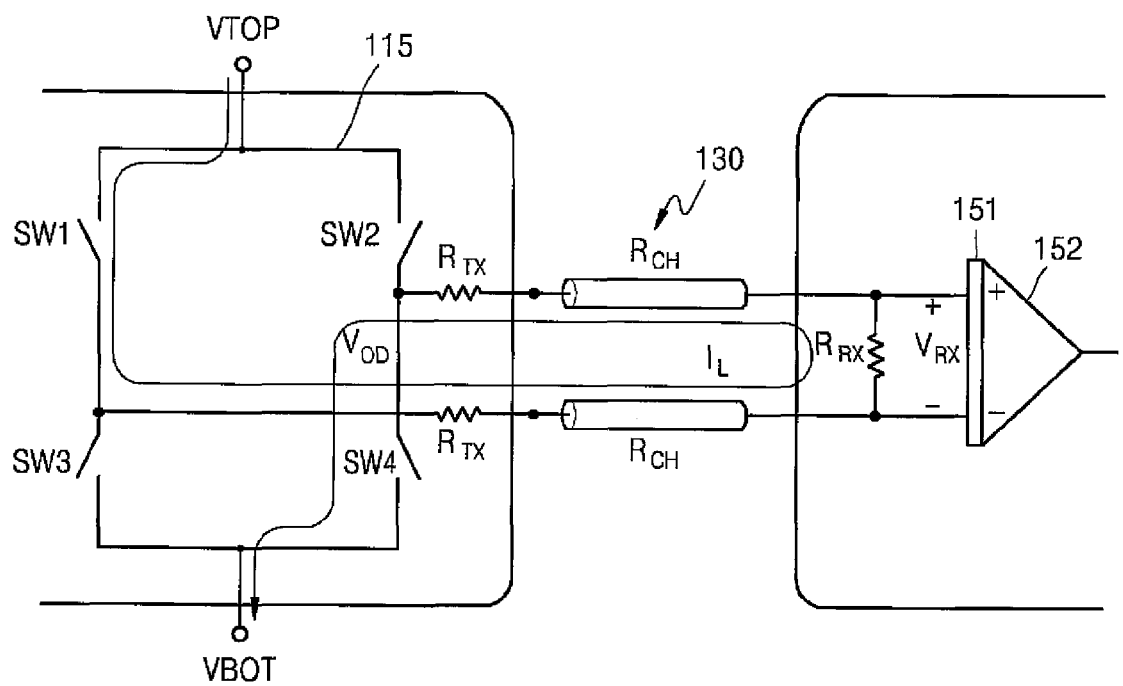
FIG. 5 is a block diagram showing a voltage signal generated when first and fourth switch arrays of the switch block of the system of FIG. 1 are turned on, according to an illustrative embodiment.

FIG. 5 is a block diagram showing a voltage signal generated when first and fourth switch arrays SW1 and SW4 of the switch block 115 of the system of FIG. 1 are turned on, according to an illustrative embodiment.

Referring to FIG. 5, when the first and fourth switch arrays SW1 and SW4 are turned on, a DC path is formed from the first reference voltage generator 112 through the first switch array SW1, the lower transmission line $R_{CH}$, the resistor $R_{RX}$, the upper transmission line $R_{CH}$ and the fourth switch array SW4 to the second reference voltage VBOT. Thus, the voltage that is applied to the positive input terminal (+) of the comparator 152 of the receiver 150 is lower than the voltage that is applied to the negative input terminal (−) of the comparator 152.

A relative amount of DC voltage that drops across the two terminals of the resistor $R_{RX}$ of the receiver 150 is determined due to the first switch control signals DNP1 to DNP4 through fourth switch control signals DNN1 to DNN4. The DC voltage drop across the two terminals of the resistor $R_{RX}$ of the receiver 150 is converted by the comparator 152.

Logic values of the first switch control signals DNP1 to DNP4 through fourth switch control signals DNN1 to DNN4 are determined using data to be transmitted by the transmitter 110 to the receiver 150. When the system 100 for transmitting and receiving a signal illustrated in FIG. 1 is an image reproducing apparatus, for example, that is implemented in a chip on glass (COG) environment, the transmitter 110 may be a timing controller and the receiver 150 may be a source driver that drives a display panel.

When the logic values of the first switch control signals DNP1 to DNP4 through fourth switch control signals DNN1 to DNN4 are determined, values of display data may be referred to.

By performing the method of transmitting and receiving a voltage signal implemented by the system 100 illustrated in FIG. 1, the magnitude of the voltage signal that is transmitted or received may be minimized. The method for transmitting and receiving a voltage signal according to an embodiment is substantially the same as a related method for transmitting and receiving a differential current signal in that there may be a leakage current on the DC paths illustrated in FIGS. 4 and 5, and a delay component of a signal exists in the DC paths illustrated in FIGS. 4 and 5 due to an electrical characteristic of the transmission line 130. However, only a resistance component exists between sources of the first reference voltage VTOP and the second reference voltage VBOT. In the method for transmitting and receiving a voltage signal according to an embodiment, the magnitudes of leakage current and the delay component insubstantially affect the DC voltage at the positive terminal of the resistor $R_{RX}$ of the receiver 150.

In addition, since the DC voltage drop on the two terminals of the resistor $R_{RX}$ of the receiver 150 is actually amplified, the effect of the magnitudes of the leakage current and the delay component of the signal on the DC voltage is further reduced. Thus, although the effect is considered, a potential difference between the first reference voltage VTOP and the second reference voltage VBOT can be minimized. Power consumption of the entire system can be reduced and the transmission speed of the system can be increased by reducing the magnitude of the DC voltage drop across the two terminals of the resistor $R_{RX}$.

In addition, the system 100 can adjust voltage gain of the system 100 for transmitting and receiving a signal and a bandwidth of the signal that is transmitted or received.

In the case of the related method for transmitting and receiving a differential current signal, an output voltage $V_{TX}(t)$ of the transmitter 110 and an input voltage $V_{RX}(t)$ of the receiver 150 may be obtained using Equation 1, as follows:

$$V_{TX}(t) = I_{IN}(R_{CH} + R_{RX})\left(1 - e^{-\frac{t}{\tau 1}}\right), \tau 1 = (R_{CH} + R_{RX})C_S \quad \text{(Equation 1)}$$

$$V_{RX}(t) = I_{IN}R_{RX}\left(1 - e^{-\frac{t}{\tau C}}\right), \tau C = \tau 1 + \tau 2, \tau 2 = R_{RX}C_L$$

Referring to Equation 1, $I_{IN}$ is the magnitude of a current signal to be transmitted or received, $R_{CH}$ is an equivalent resistance of the transmission line 130, $R_{RX}$ is the resistance of the resistor $R_{RX}$ of the receiver 150, $C_S$ is equivalent capacitance between the transmission line 130 and the glass substrate, and $C_L$ is load capacitance. Also, a total delay component $\tau_C$ of the current signal $I_{IN}$ to be transmitted is the sum of two delay components ($\tau_1 + \tau_2$).

Figure 6:
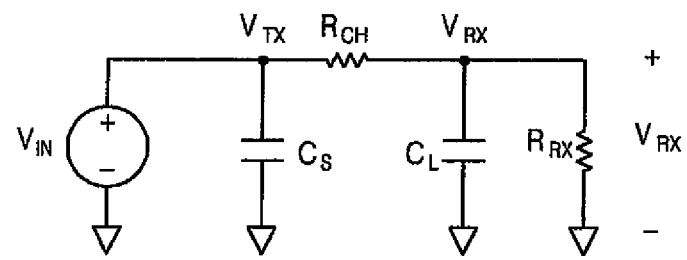
FIG. 6 is a circuit diagram showing an equivalent circuitry model of the system illustrated in the FIG. 1, according to an illustrative embodiment.

FIG. 6 is a circuit diagram showing an equivalent circuitry model of the system 100 illustrated in FIG. 1, according to an illustrative embodiment.

Voltage gain of the system illustrated in FIG. 6 may be obtained using Equation 2, as follows:

$$\frac{V_{RX}(t)}{V_{TX}(t)} = \frac{R_{RX}}{R_{CH} + R_{RX}}\left(1 - e^{-\frac{t}{\tau V}}\right), \tau V \approx (R_{CH} \mid R_{RX})C_L \quad \text{(Equation 2)}$$

A frequency $f_{MAX}$ of a voltage signal may be obtained using Equation 3, as follows.

$$f_{MAX} = \frac{1}{4.6 \cdot \tau V} = \frac{R_{CH} + R_{RX}}{R_{CH} R_{RX} C_L} \quad \text{(Equation 3)}$$

Referring to Equations 2 and 3, the voltage gain of the system illustrated in FIG. 6 is determined by the equivalent resistance $R_{CH}$ of the transmission line 130 and resistance $R_{RX}$ of the resistor $R_{RX}$ of the receiver 150. The frequency $f_{MAX}$ of the voltage signal is determined by the equivalent resistance $R_{CH}$ of the transmission line 130 and resistance $R_{RX}$ of the resistor $R_{RX}$ of the receiver 150, and capacitance $C_L$ of a load capacitor. Since the equivalent resistance $R_{CH}$ of the transmission line 130 and the capacitance $C_L$ of the load capacitor are fixed, only the resistance $R_{RX}$ of the resistor $R_{RX}$ of the receiver 150 varies to vary the voltage gain.

For example, as the resistance $R_{RX}$ of the resistor $R_{RX}$ of the receiver 150 is increased, the voltage gain of the system illustrated in FIG. 6 increases, and the frequency $f_{MAX}$ of the voltage signal decreases. Conversely, as the equivalent resistance $R_{CH}$ of the transmission line 130 is decreased, the voltage gain of the system illustrated in FIG. 6 decreases, and the frequency $f_{MAX}$ of the voltage signal increases.

Experimental conditions and computer simulation results for the system 100 for transmitting and receiving a signal illustrated in FIG. 1 will now be described.

FIG. 7 shows computer simulation results for bandwidth and voltage gain according to magnitudes of two voltage signals, according to an illustrative embodiment.

Referring to FIG. 7, as the magnitude of the voltage signal ($V_{OD}=|V_1-V_2|$) is reduced, for example, from about 600 mV to about 200 mV, bandwidth increases, while voltage gain decreases. The bandwidth is the available range of a transmitting and receiving frequency.

FIG. 8 shows computer simulation results for bandwidth and electromagnetic interference (EMI) according to changes in a resistance component of the transmitting terminal, according to an illustrative embodiment.

Referring to FIG. 8, a resistance component of the transmitter 110 refers to the turn-on resistance of the multiple switches that constitute the switch block 115. Each switch array includes four switch transistors, for example, and turn-on resistance of each of the switch transistors is about 320Ω. Thus, the resistance component of a channel of the transmitter 110 is reduced from 320Ω to 160Ω, 120Ω, and 80Ω whenever the switch transistors connected in parallel are sequentially turned on.

As the resistance of the transmitter 110 is increased, for example, from about 80Ω to about 320Ω, the EMI of the system increases, while the available range (bandwidth) of a transmitting frequency decreases.

FIG. 9 shows computer simulation results for bandwidth and voltage gain according to changes in a resistant component of a receiving terminal, according to an illustrative embodiment.

Referring to FIG. 9, as the resistance of the resistor $R_{RX}$ of the receiver 150 is increased, for example, from about 400Ω to about 800Ω, the voltage gain increases, and the bandwidth of a received frequency decreases. Also, when the resistor $R_{RX}$ is not used at the receiver 150 (open), the voltage gain further increases, and the bandwidth of the frequency further decreases.

The results of FIGS. 7 through 9 may be inferred by qualitative-analyzing Equations 2 and 3.

FIG. 10 is a table showing electrical characteristics of various architectures, including an embodiment of the inventive concept, for purposes of comparison.

Referring to FIG. 10, mLVDS and WiseBus™ implementations have larger amounts of average current flows and greater magnitudes of peak current, than the system for transmitting and receiving a signal according to the inventive concept. The larger average current and peak current result in greater power consumption. When a system is miniaturized, and the size of a cell used in the system is reduced, greater power consumption of the system may adversely affect the competitiveness of products that incorporate the system.

Figure 11:
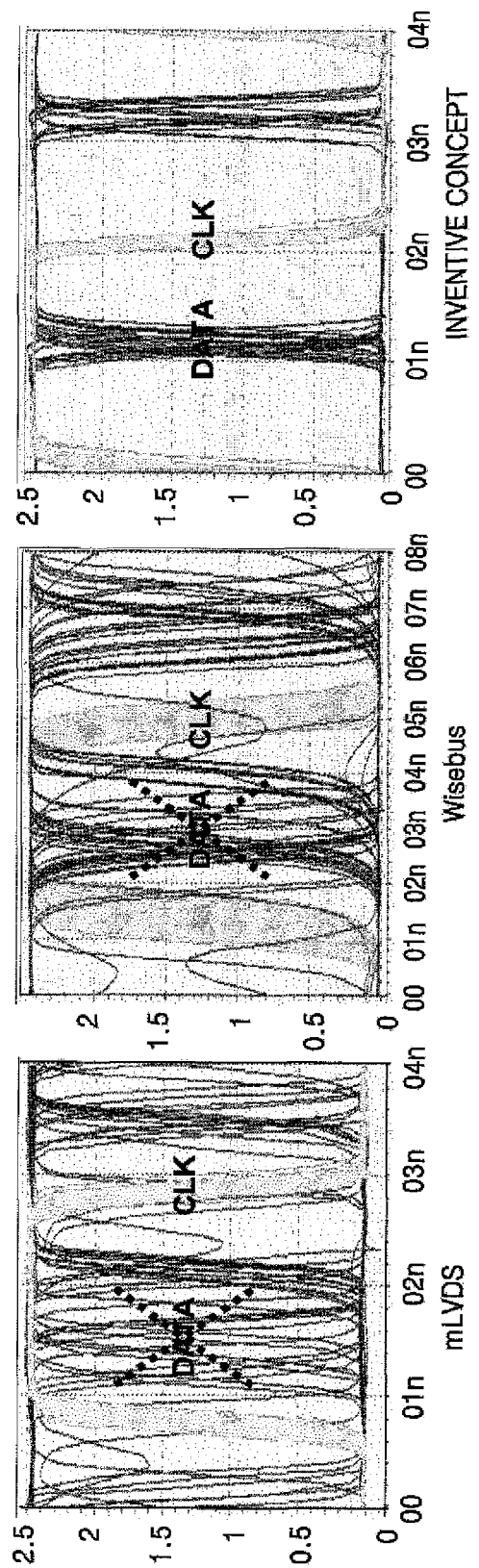
FIG. 11 shows results of simulations for electrical characteristics in an interface manner, including an embodiment of the inventive concept, for purposes of comparison.

FIG. 11 shows results of simulations for electrical characteristics in an interface manner, including an embodiment of the inventive concept, for purposes of comparison.

Referring to FIG. 11, in the case of the system according to the inventive concept, the simulation confirms that the format of transmitted data DATA and the format of clock signal CLK each have less deviation as compared to mLVDS and WiseBus™ implementations.

Figure 12:
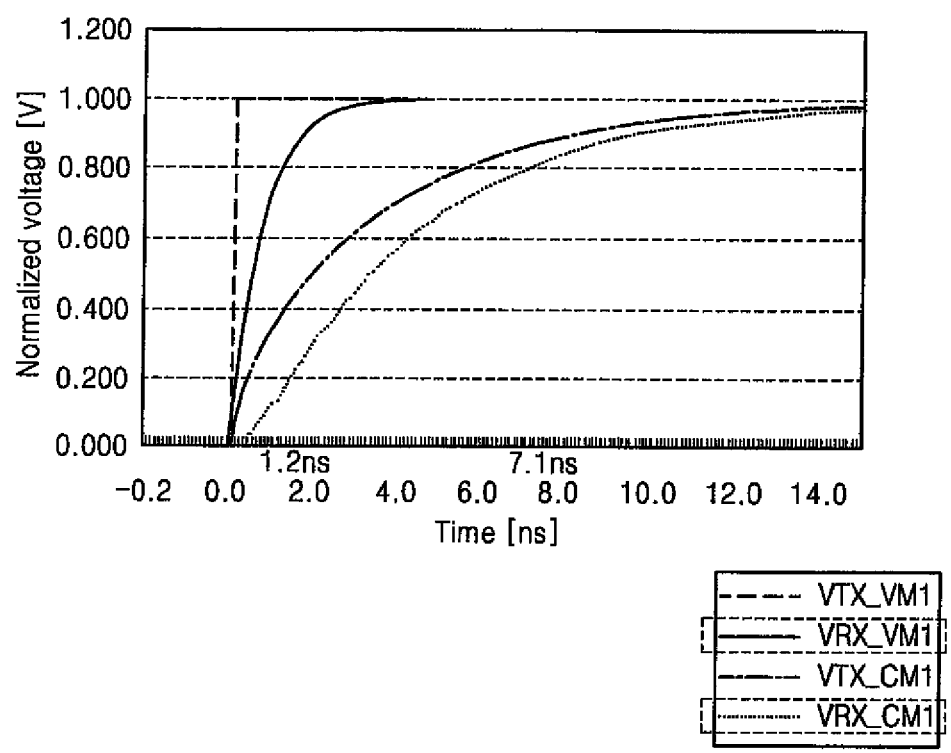
FIG. 12 is a waveform diagram of an input/output signal according to type of transmitted signal, according to an illustrative embodiment.

FIG. 12 is a waveform diagram of an input/output signal according to type of transmitted signal, according to an illustrative embodiment.

Referring to FIG. 12, when a transmitted signal is a current signal VTX_CM1, the response characteristic is better than when a transmitted signal is a voltage signal VTX_VM1. In the case of a received signal, the voltage signal VRX_VM1 responds at about 1.2 nanoseconds (ns), whereas the current signal VRX_CM1 responds at about 7.1 ns, which is five times slower than the response of the voltage signal VRX_VM1.

Figure 13:
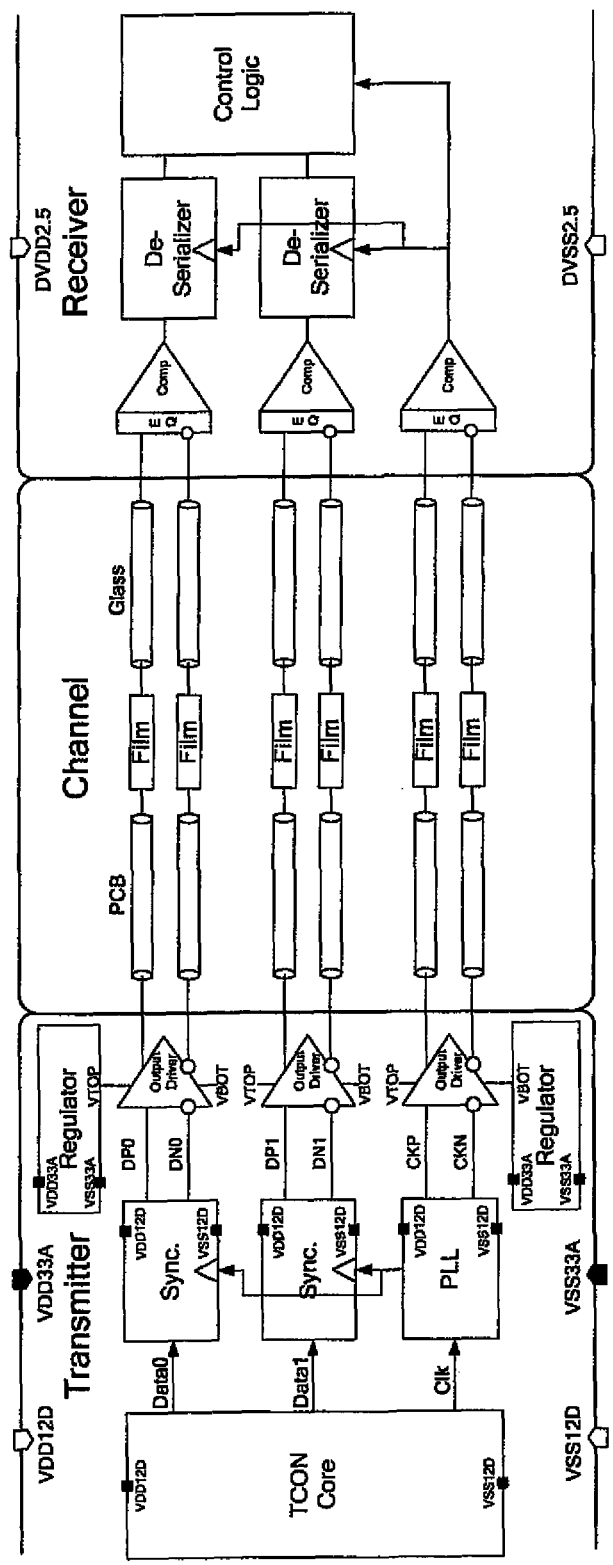
FIG. 13 is a block diagram showing a system for transmitting and receiving a signal, according to another illustrative embodiment.

FIG. 13 is a block diagram showing a system for transmitting and receiving a signal, according to another illustrative embodiment.

Referring to FIG. 13, the system for transmitting and receiving a signal according to the depicted illustrative embodiment may be used when multiple pieces of transmitting and receiving data are used in a point-to-point manner.

As described above, embodiments of the inventive concept may be used in a display system. However, various embodiments may also be used in a display driver integrated circuit (DDI), e.g., an organic light emitting diode (OLED), a plasma display panel (PDP), a liquid crystal display (LCD), a flexible driver integrated circuit (D-IC), or the like.

In this respect, the competitive power of products incorporating the various embodiments may be substantially improved.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A system for transmitting and receiving a signal, the system comprising: a transmitter switching a first reference voltage and a second reference voltage and generating first and second voltage signals; and a receiver including an input resistor having two terminals respectively receiving the first and second voltage signals, wherein the transmitter comprises: a reference voltage generator generating the first reference voltage and the second reference voltage; and a switch block switching the first reference voltage and the second reference voltage and outputting the first and second voltage signals, and comprising: a first switch array switching the first reference voltage in response to at least one of a plurality of switch control signals to output the second voltage signal; a second switch array switching the first reference voltage in response to at least one of a second plurality of switch control signals to output the first voltage signal; a third switch array switching the second reference voltage in response to at least one of a third plurality of switch control signals to output the second voltage signal; and a fourth switch array switching the second reference voltage in response to at least one of a fourth plurality of switch control signals to output the first voltage signal, wherein at least one of each one of the first plurality of switch control signals, the second plurality of switch control signals, the third plurality of switch control signals, and the fourth plurality of switch control signals is determined by at least one of a voltage gain between the transmitter and the receiver, and a frequency range for the first and second voltage signals.

2. The system of claim 1, wherein the reference voltage generator comprises a first reference voltage generator and a second reference voltage generator, wherein the first reference voltage generator comprises:

a first differential operational amplifier comprising first and second input terminals and an output terminal, wherein a first bias voltage is applied to the first input terminal of the first differential operational amplifier; and a first metal oxide semiconductor (MOS) transistor, wherein a first terminal of the first MOS transistor is connected to a first power supply and a gate of the first MOS transistor is connected to the output terminal of the first differential operational amplifier, the first MOS transistor generating the first reference voltage at a second terminal of the first MOS transistor, connected to the second input terminal of the first differential operational amplifier, in response to an output voltage from the output terminal of the first differential operational amplifier, wherein the second reference voltage generator comprises:

a second differential operational amplifier comprising first and second input terminals and an output terminal, wherein a second bias voltage is applied to the first input terminal of the second differential operational amplifier; and a second MOS transistor, wherein a first terminal of the second MOS transistor is connected to a ground voltage source and a gate of the second MOS transistor is connected to the output terminal of the second differential operational amplifier, the second MOS transistor generating the second reference voltage at a second terminal of the second MOS transistor, connected to the second input terminal of the second differential operational amplifier, in response to an output voltage from the output terminal of the second differential operational amplifier.

3. The system of claim 1, wherein the first switch array comprises at least one first switch transistor switching the first reference voltage in response to a first switch control signal of the plurality of first switch control signals and outputting the second voltage signal, the second switch array comprises at least one second switch transistor switching the first reference voltage in response to a second switch control signal of the plurality of second switch control signals and outputting the first voltage signal, the third switch array comprises at least one third switch transistor switching the second reference voltage in response to a third switch control signal of the plurality of third switch control signals and outputting the second voltage signal, and the fourth switch array comprises at least one fourth switch transistor switching the second reference voltage in response to a fourth switch control signal of the plurality of fourth switch control signals and outputting the first voltage signal.

4. The system of claim 1, wherein a pair of the first switch array and fourth switch array, and a pair of the second switch array and third switch array are collectively turned on and off.

5. The system of claim 1, wherein the receiver further comprises an equalizer equalizing a voltage drop across the two terminals of the resistor.

6. The system of claim 5, wherein the receiver further comprises a comparator comparing a magnitude of an equalized voltage output from the equalizer.

7. The system of claim 1, wherein one of the first reference voltage and the second reference voltage comprises a clock signal.

8. The system of claim 7, wherein the other one of the first reference voltage and the second reference voltage comprises data.

9. The system of claim 1, wherein the receiver is mounted on a glass substrate, and a transmission line connecting the transmitter output terminal with the receiver comprises a metal line disposed on the glass substrate.

10. The system of claim 1, wherein the system is used in one of a display driver integrated circuit (DDI), an organic light emitting diode (OLED), a plasma display panel (PDP), a liquid crystal display (LCD), and a flexible driver integrated circuit (D-IC).

11. A system for transmitting and receiving a signal, the system, the system comprising: a timing controller including a transmitter that converts display data into first and second voltage signals, wherein the transmitter comprises: a reference voltage generator generating a first reference voltage and a second reference voltage; and a switch block switching the first reference voltage and the second reference voltage to output the first and second voltage signals, wherein the switch block comprises: a first switch array switching the first reference voltage in response to at least one of a first plurality of switch control signals to output the second voltage signal; a second switch array switching the first reference voltage in response to at least one of a second plurality of switch control signals to output the first voltage signal; a third switch array switching the second reference voltage in response to at least one of a third plurality of switch control signals to output the second voltage signal; and a fourth switch array switching the second reference voltage in response to at least one of a fourth plurality of switch control signals to output the first voltage signal, wherein at least one of each one of the first plurality of switch control signals, the second plurality of switch control signals, the third plurality of switch control signals, and the fourth plurality of switch control signals is determined by at least one of a voltage gain between the transmitter and the receiver, and a frequency range for the first and second voltage signals; and a source driver including a receiver, the receiver including a resistor having two terminals respectively receiving the first and second voltage signals from the transmitter via a transmission line.

12. The system of claim 11, wherein the reference voltage generator comprises a first reference voltage generator and a second reference voltage generator, wherein the first reference voltage generator comprises:
- a first differential operational amplifier comprising first and second input terminals and an output terminal, wherein a first bias voltage is applied to the first input terminal of the first differential operational amplifier; and
- a first metal oxide semiconductor (MOS) transistor, wherein a first terminal of the first MOS transistor is connected to a first power supply and a gate of the first MOS transistor is connected to the output terminal of the first differential operational amplifier, the first MOS transistor generating the first reference voltage at a second terminal of the first MOS transistor, connected to the second input terminal of the first differential operational amplifier, in response to an output voltage from the output terminal of the first differential operational amplifier; and the second reference voltage generator comprises:
- a second differential operational amplifier comprising first and second input terminals and an output terminal, wherein a second bias voltage is applied to the first input terminal of the second differential operational amplifier; and
- a second MOS transistor, wherein a first terminal of the second MOS transistor is connected to a ground voltage source and a gate of the second MOS transistor is connected to the output terminal of the second differential operational amplifier, the second MOS transistor generating the second reference voltage at a second terminal of the second MOS transistor, connected to the second input terminal of the second differential operational amplifier, in response to an output voltage from the output terminal of the second differential operational amplifier.

13. The system of claim 11, wherein the first switch array comprises at least one first switch transistor switching the first reference voltage in response to a first switch control signal among the first plurality of switch control signals to output the second voltage signal, the second switch array comprises at least one second switch transistor switching the first reference voltage in response to a second switch control signal among the second plurality of switch control signals to output the first voltage signal, the third switch array comprises at least one third switch transistor switching the second reference voltage in response to a third switch control signal among the third plurality of switch control signals to output the second voltage signal, and the fourth switch array comprises at least one fourth switch transistor switching the second reference voltage in response to a fourth switch control signal among the fourth plurality of switch control signals to output the first voltage signal.

14. The system of claim 13, wherein a pair of the first switch array and fourth switch array, and a pair of the second switch array and third switch array are collectively turned on and off.

15. The system of claim 13, wherein least one of the first, second, third and fourth switch control signals is determined by the display data.

16. The system of claim 11, wherein one of the first reference voltage and the second reference voltage is a clock signal, and the other one of the first reference voltage and the second reference voltage is a data signal.

17. The system of claim 1, wherein the at least one of each one of the first plurality of switch control signals, the second plurality of switch control signals, the third plurality of switch control signals, and the fourth plurality of switch control signals is determined by the voltage gain between the transmitter and the receiver, and the frequency range for the first and second voltage signals.

18. The system of claim of claim 11, wherein the at least one of each one of the first plurality of switch control signals, the second plurality of switch control signals, the third plurality of switch control signals, and the fourth plurality of switch control signals is determined by the voltage gain between the transmitter and the receiver, and the frequency range for the first and second voltage signals.

19. The system of claim 11, wherein the source driver is mounted on a glass substrate, and a transmission line connecting the timing controller with the source driver comprises a metal line disposed on the glass substrate.

20. The system of claim 11, wherein the system is used in one of a display driver integrated circuit (DDI), an organic light emitting diode (OLED), a plasma display panel (PDP), a liquid crystal display (LCD), and a flexible driver integrated circuit (D-IC).

* * * * *